(12) United States Patent
Da Dalt

(10) Patent No.: US 7,847,643 B2
(45) Date of Patent: Dec. 7, 2010

(54) CIRCUIT WITH MULTIPHASE OSCILLATOR

(75) Inventor: Nicola Da Dalt, Villach (AT)

(73) Assignee: Infineon Technologies AG, Neubiberg (DE)

( * ) Notice: Subject to any disclaimer, the term of this patent is extended or adjusted under 35 U.S.C. 154(b) by 92 days.

(21) Appl. No.: 12/267,277

(22) Filed: Nov. 7, 2008

(65) Prior Publication Data

US 2010/0117742 A1 May 13, 2010

(51) Int. Cl.
*H03B 27/00* (2006.01)

(52) U.S. Cl. .......................... 331/45; 331/1 A; 331/25; 331/135

(58) Field of Classification Search .................. 331/1 A, 331/25, 45, 135
See application file for complete search history.

(56) References Cited

U.S. PATENT DOCUMENTS

| 5,059,924 | A | * | 10/1991 | JenningsCheck ............. 331/1 A |
|---|---|---|---|---|
| 5,724,285 | A | | 3/1998 | Shinohara |
| 6,181,213 | B1 | * | 1/2001 | Chang .......................... 331/34 |
| 6,369,661 | B1 | * | 4/2002 | Scott et al. ..................... 331/45 |
| 6,445,252 | B1 | * | 9/2002 | Eilken et al. .................. 331/34 |
| 6,690,209 | B1 | * | 2/2004 | Cyrusian ....................... 327/12 |
| 6,943,599 | B2 | * | 9/2005 | Ngo ............................. 327/156 |
| 7,298,216 | B2 | * | 11/2007 | Shigemori ................. 331/1 A |
| 2001/0055357 | A1 | * | 12/2001 | Chen .......................... 375/376 |
| 2002/0089356 | A1 | | 7/2002 | Perrott et al. |
| 2006/0255866 | A1 | * | 11/2006 | Hirai ............................ 331/45 |
| 2007/0025490 | A1 | | 2/2007 | Azadet et al. |
| 2007/0030939 | A1 | | 2/2007 | Gazsi |
| 2007/0285178 | A1 | | 12/2007 | Werker |
| 2008/0012647 | A1 | | 1/2008 | Risbo et al. |
| 2008/0068236 | A1 | | 3/2008 | Sheba et al. |
| 2008/0084250 | A1 | | 4/2008 | Ishikawa et al. |

OTHER PUBLICATIONS

ISSCC 2004, Session 15, Wireless Consumer ICs, 15.3.

* cited by examiner

*Primary Examiner*—Joseph Chang
*Assistant Examiner*—Jeffrey Shin
(74) *Attorney, Agent, or Firm*—Lee & Hayes, PLLC

(57) ABSTRACT

In an embodiment, a circuit is provided comprising a multiphase oscillator configured to output a plurality of output signals having the same frequency and different phase offsets. A feedback value is generated based on at least two of said output signals. A reference value is generated based on a reference clock and a predetermined value. The reference value and the feedback value are combined.

25 Claims, 3 Drawing Sheets

CIRCUIT WITH MULTIPHASE OSCILLATOR

BACKGROUND

In many different kinds of electronic devices, for example in communication devices, phase-locked loops (PLLs) are used for frequency synthesis. In general, with phase-locked loops output signals may be generated which have a predetermined frequency and phase relationship with a reference signal, for example a reference clock signal.

Controlling such phase-locked loops conventionally involves the determination of a phase and/or frequency relationship between the output signal of the phase-locked loop and the reference signals. In some application, for example in digital phase-locked loops, a low resolution of such a phase difference detection may cause unwanted effects like jitter which may comprise low frequency components.

SUMMARY

In an embodiment, a circuit is provided. The circuit according to an embodiment comprises a multiphase oscillator configured to output a plurality of output signals having the same frequency and different phase offsets, a feedback value generator configured to generate a feedback value depending on at least two of said plurality of outputs, and a reference value generator configured to generate a reference value depending on a reference clock and a predetermined value. Furthermore, the circuit comprises a loop filter configured to control the multiphase oscillator depending on the feedback value and the reference value.

In other embodiments, other elements and/or signals may be used.

DETAILED DESCRIPTION OF THE INVENTION

Figure 1:
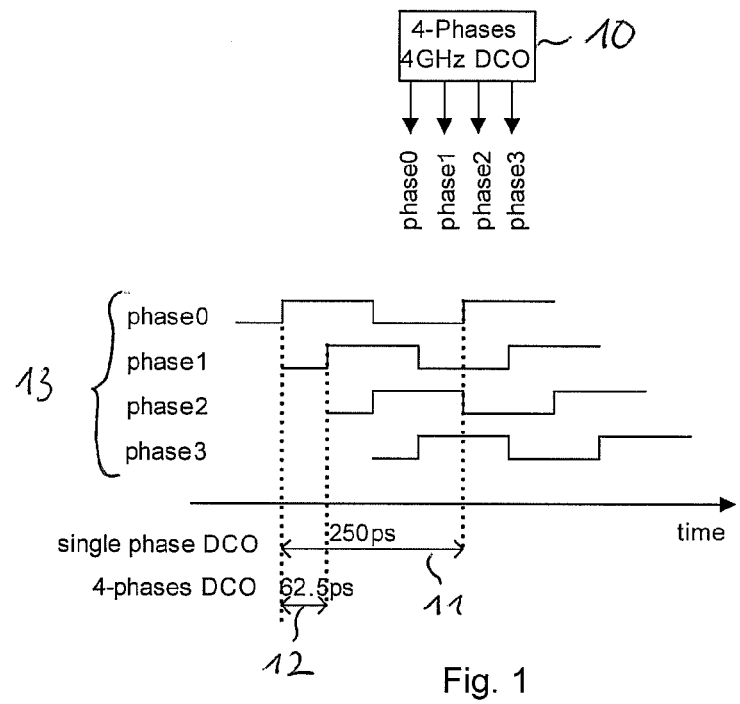
FIG. 1 shows a diagram for explaining some features of some embodiments of the present invention.

In the following, embodiments of the present invention will be described in detail with reference to the attached drawings. It is to be noted that the embodiments described hereinafter are merely intended to illustrate the present invention and are not to be construed as limiting the scope thereof. It is to be understood that in the following description of embodiments, any direct connection or coupling between functional blocks, device, components, circuit elements or other physical or functional units shown in the drawings or described herein, i.e. any connection without intervening elements, could also be implemented by an indirect connection or coupling, i.e. a connection or coupling with one or more additional intervening elements. Furthermore, it should be appreciated that the partitioning of embodiments into functional blocks or units shown in the drawings is not to be construed as indicating that these units necessarily are implemented physically separate. Generally, functional blocks or units may be implemented as separate circuits, chips or elements, but two or more functional blocks or units may also be implemented in a common circuit or common chip.

It is to be understood that features of various embodiments described hereinafter may be combined with each other unless specifically noted otherwise.

Furthermore, it is to be understood that describing an embodiment comprising a plurality of elements is not to be construed as indicating that all these elements are necessary for practicing the present invention. Instead, in other embodiments, only some of such elements and/or alternative elements may be present.

It is to be noted that any directional terminology like "top", "bottom", "left" or "right" used in the following detailed description is merely used for easy reference to certain portions of the drawings and is not to be construed as limiting the actual positioning of elements of embodiments in implementations thereof.

In the figures, like reference numerals indicate similar or equivalent, but not necessarily identical elements.

In the following, phase-locked loops (PLLs) according to embodiments of the present invention will be described.

A phase-locked loop according to some embodiments may comprise a digitally controlled oscillator (DCO). Generally, a digitally controlled oscillator is an oscillator the output frequency or output frequencies of which may be controlled using a digital control signal.

In some embodiments of the present invention, a multiphase oscillator is used. A multiphase oscillator is an oscillator which is configured to output a plurality of output signals having the same frequency, wherein the output signals are phase offset from each other. For example, a multiphase oscillator may output four output signals which have successive phase offsets of 90 degree (i.e. a second signal is offset with respect to a first signal by 90 degrees, a third signal is offset with respect to the second signal by 90 degrees, and a fourth signal is offset with respect to the third signal by 90 degrees). However, multiphase oscillators may generate any number of output signals, i.e. they are not limited to four output signals, and may use any desired or suitable phase offset between the signals. It should be noted that the phase offset between the signals need not be constant and need not add up to 360 degrees. An example for a multiphase oscillator is a so-called ring oscillator.

In phase-locked loops, generally a phase of the output signal(s) from an oscillator is in some manner aligned to, i.e. adjusted to have a predetermined relationship with, a phase of a reference clock signal. In some embodiments of the present invention some or all of the output signals of a multiphase oscillator are used for this phase alignment. This is schematically illustrated in FIG. 1.

FIG. 1 shows a multiphase DCO 10 which in the example of FIG. 1 outputs four output signals, labeled phase0 to phase3. In the example shown, the signals phase0 to phase3 have a frequency of 4 GHz, although both the number of output signals and the frequency are to be taken only as an illustrative example, and other values may be used as well.

A possible example for signals phase0 to phase3 is schematically shown in a region generally labeled 13 in FIG. 1. In the example shown, the signal have a successive phase offsets of 90 degrees, i.e. phase1 is offset by 90 degrees with respect to phase0 etc.

In some embodiments, rising edges, falling edges or both edges of the signals output by a multiphase oscillator, for example signals phase0 to phase 3 in FIG. 1, are used to determine a phase relationship with respect to a reference clock or reference signal. In some embodiments, this leads to an increase of the phase resolution. For example, if the rising edges of signals phase0 to phase3 are used, for a 4 GHz oscillator like oscillator 10, the time difference between two successive rising edges is 62.5 ps, as indicated by an arrow 12 in FIG. 1. In case only a single phase oscillator is used, or a single output signal from a multiphase oscillator is used, as indicated by an arrow 11 the time difference between two successive rising edges is 250 ps. Therefore, in some embodiments by using a plurality of outputs with different phases a resolution may be improved.

The above explanations with reference to FIG. 1 are merely intended to serve as illustration for some principles which are used in some embodiments of the present invention and are not to be construed as limiting.

Figure 2:
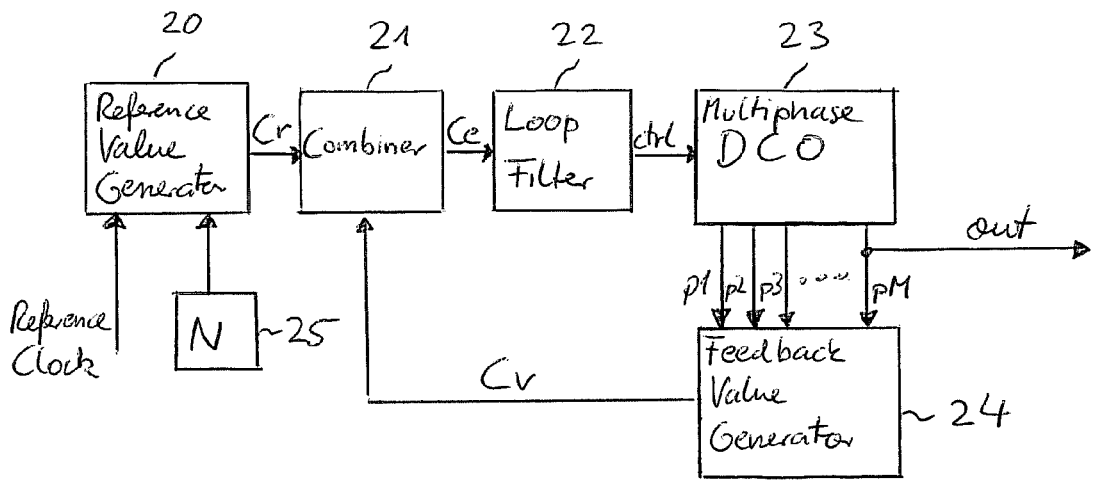
FIG. 2 shows a block diagram of a phase-locked loop according to an embodiment of the present invention.

Turning now to FIG. 2, a block diagram of a phase-locked loop according to an embodiment of the present invention is shown. The phase-locked loop of the embodiment of FIG. 2 comprises a multiphase digitally controlled oscillator (DCO) 23 which is configured to output M output signals P1, P2, P3 . . . PM which have the same frequency, but different phase offsets. For example, M may be equal to 4 and the output signals P1 to PM may be similar to the output signals phase0 to phase3 shown in FIG. 1. However, M is not limited to 4, and may be any integer number greater than 1.

In the embodiment shown in FIG. 2, signal PM is also output as output signal out of the phase-locked loop. In other embodiments, another one of the signals P1 to PM is output. In still another embodiment, the output signal may be a further signal in addition to signals p1 to PM. In still another embodiment, more than one of signals P1 to PM, for example all signals P1 to PM are used as output signals. In still another embodiment, multiphase DCO 23 may generate more than M output signals having different phases, and of these more than M output signals P1 to PM are used for a feedback loop of the phase-locked loop as described in the following.

In the embodiment of FIG. 2, signals P1 to PM are fed to a feedback value generator 24. Feedback value generator 24 in the embodiment of FIG. 2 is configured to generate a digital feedback value Cv based on signals P1 to PM. In an embodiment, feedback value Cv is indicative of a number of rising edges of signals P1 to PM, for example a number of rising edges per given time interval or a number of rising edges since a predetermined starting point. In other embodiments, falling edges or both rising and falling edges may be used.

Feedback value Cv is fed to a combiner 21, where it is combined with a digital reference value Cr. In an embodiment, combiner 21 may be a subtractor which subtracts the digital feedback value Cv from the digital reference value Cr or vice versa and outputs the difference as a digital error value Ce. In other embodiments, combiner 21 may determine the error value Ce from Cr and Cv in another manner than simple subtraction and may for example comprise an adder.

In the embodiment of FIG. 2, digital reference value Cr is generated by a reference value generator 20 based on a reference clock and a predetermined value N which in the embodiment of FIG. 2 is stored in a storage like a memory 25. N may be an integer value, but may also be a fractional, i.e. non-integer, value and in an embodiment determines a relationship of a frequency of the reference clock and a frequency of signals P1 to PM. In an embodiment, digital reference value Cr may be generated by adding N to the value of Cr every rising edge, every falling edge or every rising and falling edge of the reference clock. In other embodiments, this value may in addition be multiplied with a predetermined factor, for example a factor depending on the number of signal P1 to PM, i.e. on M.

In the embodiment of FIG. 2, digital error signal Ce is fed to a digital loop filter 22, which outputs a control signal ctrl for controlling multiphase DCO 23, for example for controlling the frequency of signals P1 to PM. Loop filter 22 may be any suitable digital filter conventionally used as loop filter in phase-locked loops.

Examples for the implementation of various elements shown in FIG. 2 like reference value generator 20, combiner 21 or feedback value generator 24 will be explained with reference to further embodiments in the following.

Figure 3:
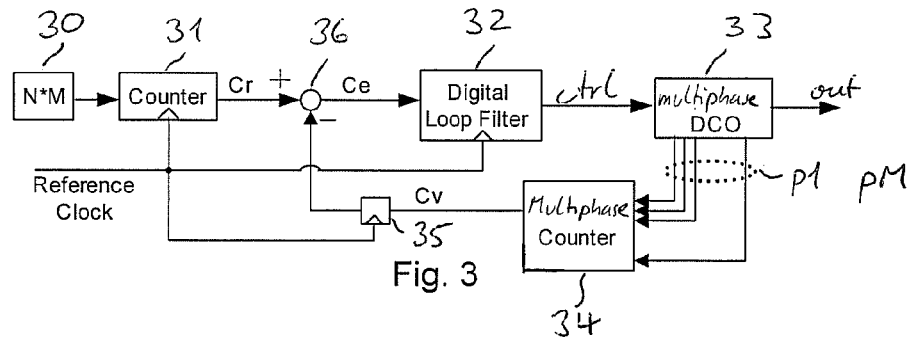
FIG. 3 shows a block diagram of a phase-locked loop according to a further embodiment of the present invention.

In FIG. 3, a phase-locked loop according to a further embodiment of the present invention is shown.

In the phase-locked loop of FIG. 3, a multiphase DCO 33 is provided, which provides M output signals P1 to PM having the same frequency, but different phase offsets, similar to what has been explained already with reference to FIG. 2. Additionally, an output signal out which may, but need not be identical to one of signals P1 to PM is provided. The variations and alternatives discussed with reference to multiphase DCO 23 of FIG. 2 are also applicable to multiphase DCO 33 of the embodiment of FIG. 3.

The output signals P1 to PM are fed to a multiphase counter 34, which is a counter configured to count based on a plurality of input signals having different phases, e.g. in the embodiment of FIG. 3 is configured to count the rising edges of P1 to PM. In other words, counter 34 outputs a feedback signal Cv which is increased with every rising edge of one of the signals P1 to PM. In other embodiments, falling edges or both rising and falling edges may be used.

Feedback signal Cv is fed to a sampling unit 35 clocked with a reference clock. Sampling unit 35 may for example comprise a flip-flop, a latch or another type of register. With sampling unit 35, the feedback signal Cv is transferred to the clock domain of the reference clock, i.e. becomes a digital signal clocked by the reference clock. The thus generated output signal of sampling unit 35, the value of which corresponds to the feedback value Cv is fed to a negative input of a subtractor 36.

The phase-locked loop of the embodiment of FIG. 3 further comprises a storage, e.g. a memory 30 storing in the embodiment of FIG. 3 a value N·M, N being an integer or fractional value as in the embodiment of FIG. 2 and M being the number of signals P1 to PM fed to counter 34. In another embodiment, in memory 30 only N may be stored, and the multiplication with M may be performed in a different unit.

The value N·M is fed to a counter 31 which is clocked with the reference clock. Counter 31 outputs a reference value Cr which is increased by N·M at every rising edge of the reference clock. The reference value Cr is fed to a positive input of subtractor 36, and subtractor 36 consequently outputs a digital error value Ce corresponding to Cr−Cv.

Error signal Ce is fed to a digital loop filter 32 clocked by reference clock which outputs a control signal ctrl based on Ce for controlling multiphase DCO 33, for example for controlling the frequency of signals P1 to PM.

With a control loop as described above, multiphase DCO 33 is basically controlled to minimize the signal Ce, such that Cr at least approximately becomes equal to Cv. In other words, the output frequency of the multiphase DCO 33 is controlled to be approximately equal to N times the frequency of the reference clock.

Figure 4:
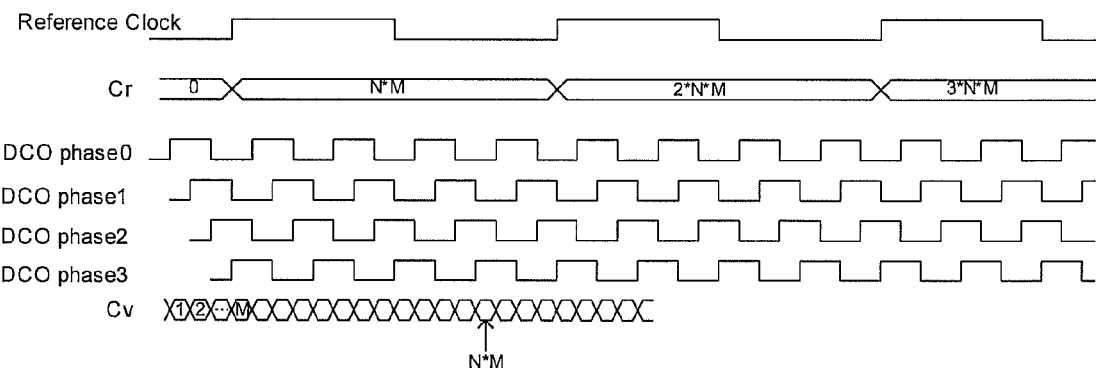
FIG. 4 shows examples for waveforms in a particular implementation of the embodiment of FIG. 3.

To further illustrate the functioning of the phase-locked loop of the embodiment of FIG. 3, examples for waveforms of signals used therein will be explained with reference to FIG. 4. For the illustrative example of FIG. 4, it is assumed that M=4, i.e. the multiphase DCO 32 outputs four signals, which in FIG. 4 are labeled DCO phase0 to DCO phase3 and which are offset successively by 90 degrees. Furthermore, in FIG. 4 the reference clock, the reference value Cr and the feedback value Cv is shown in an illustrative manner.

As illustrated in FIG. 4, with each rising edge of the reference clock, the value of Cr is increased by N·M, i.e. from 0 to N·M at the first rising edge, from N·M to 2·N·M at the second rising edge etc. As can be seen, within N clock cycles of DCO phase0 or any other of the signals output by the DCO, Cv increases by N·M, and when reference clock and the signals output by the multiphase DCO 33 are aligned, this time corresponds to one clock period of the reference clock in which the signal Cr also increases by N·M.

It should be noted that the waveforms and signals shown in FIG. 4 serve only as examples for further illustrating the functioning of the embodiment of FIG. 3, and the signals of FIG. 3 are not limited to the ones shown in FIG. 4. For example, more output signals of multiphase DCO 33 and/or signals having different phase offsets than the ones shown may be used.

Figure 5:
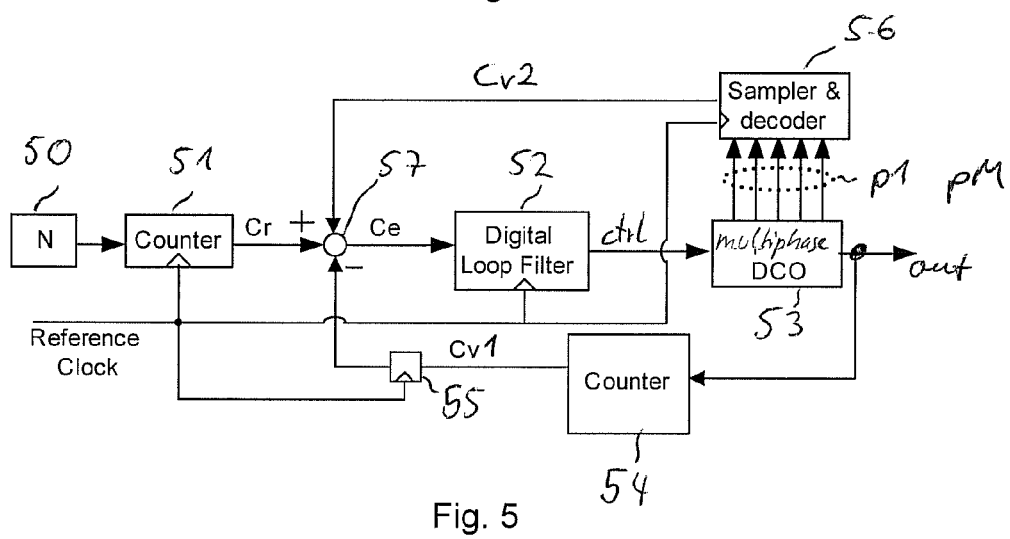
FIG. 5 shows a block diagram of a phase-locked loop according to another embodiment of the present invention.

Turning now to FIG. 5, a phase-locked loop according to a further embodiment of the present invention is shown. The phase-locked loop shown in FIG. 5 comprises a multiphase DCO 53 which outputs M output signals P1 to PM having the same frequency, but different phase offsets, and an output signal out which may correspond to one of signals P1 to PM, similar to multiphase DCO 33 of the embodiment of FIG. 3. The variations and modifications discussed with respect to DCOs 23 and 33 of FIGS. 2 and 3 are applicable also to multiphase DCO 53 of FIG. 5.

The output signal out is fed to a counter 54 which is configured to output a first feedback value Cv1 and to increase this value at every rising edge of output signal out. Output signal out has the same frequency as signals P1 to PM in the embodiment of FIG. 5. Therefore, Cv1 is increased once in every period of one of signals P1 to PM.

The first feedback value Cv1 is sampled at a sampling unit 55 which may comprise a flip flop or other type of register and which is clocked by the reference clock. The thus sampled value is fed to a negative input of a subtractor 57.

Furthermore, a reference value Cr is fed to a positive input of subtractor 57. Reference value Cr is generated by a counter 51 clocked by the reference clock to which a value N from a storage like memory 50 is fed. N as in the previously described embodiment defines a ratio between a frequency of the output signal out and a frequency of the reference clock and may be an integer or fractional, i.e. non-integer value. In the embodiment of FIG. 5, reference value Cr is increased by N every rising edge of the reference clock. As in previous embodiments, generally instead of only rising edges, rising and falling edges or only falling edges of the reference clock signal and/or the output signal out may be used.

Furthermore, in the embodiment of FIG. 5 the output signals P1 to PM are fed to a sampler and decoder circuit 56 which samples the signals P1 to PM based on the reference clock and which is configured to output a second feedback signal Cv2 which is fed to a further input of subtractor 57. Depending on the decoding in sampler and decoder circuit 56, the further input may be a positive or negative input.

For example, in an embodiment the sampler and decoder circuit 56 may sample signals P1 to PM, count the number of positive values (i.e. the number of signals P1 to PM which at the sampling point defined by the reference clock are in a logic one state and not in a logic zero state), divide this number by M, i.e. the number of signals P1 to PM, and output the thus generated value as feedback value Cv2. Such a circuit 56 may be implemented using logic gates. In such an embodiment, the further input of subtractor 57 may be a further negative input, such that both Cv1 and Cv2 are subtracted from Cr to form an error value Ce which is fed to a digital loop filter 52 which is clocked by the reference clock to yield a control signal ctrl for controlling multiphase DCO 53. In general, first feedback value Cv1 may be seen as a value related to a number of full clock periods of output signal out (since Cv1 is increased every rising edge of output signal out), while Cv2 may be seen as a "fractional" part of the phase position, i.e. a position within a given full-clock cycle, which is determined with a resolution depending on the number of signals P1 to PM used.

The above embodiments serve merely as some examples for possible implementations of embodiments of the present invention, and numerous modifications and variations are possible. For example, in the above embodiments a plurality of signals output from a multiphase oscillator having the same frequency but different phases are used to generate some feedback value. In other embodiments, these output signals are not used directly, but fed to a phase interpolator to generate a greater plurality of signals having the same frequency and different phases. This will be explained with reference to FIG. 6.

Figure 6:
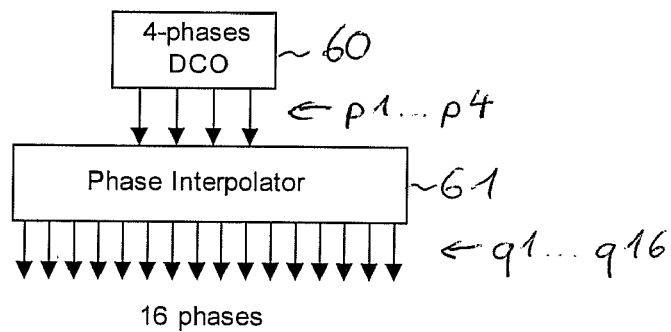
FIG. 6 shows a block diagram of a part of a phase-locked loop according to an embodiment of the present invention.

In FIG. 6, as an example a four-phase digitally controlled oscillator 60 is shown outputting four output signals P1-P4 having the same frequency but different phases. These signals P1-P4 are fed to a phase interpolator 61. In the example shown in FIG. 6, phase interpolator 61 uses signals P1-P4 to generate 16 signals Q1-Q16 which in an embodiment all have the same frequency as signals P1-P4 and have successively different phases. For example, in an embodiment signals P1-P4 as illustrated for signals phase 0-phase 3 in FIG. 1 may be offset successively by 90 degrees, and signals Q1-Q16 may then be offset successively by 22.5 degrees. However, the phase offsets of the signals need not be constant.

In an embodiment, phase interpolator 61 generates signals having intermediate phases between two adjacent signals fed to it. For example, in the embodiment of FIG. 6 P1 may correspond to Q1, P2 may correspond to Q5, P3 may correspond to Q9 and P4 may correspond to Q13, and phase interpolator 61 in such an example generates three intermediate signals between two adjacent ones of signals P1-P4.

As phase interpolator 61, any conventional phase interpolator may be used, for example a phase interpolator which multiplies two signals having different phases fed to it with respective weighting factors, adds the weighted signals and filters the added signal.

A structure like the one explained with reference to FIG. 6 may be used in any of the previously and subsequently described embodiments to replace the respective digitally controlled oscillator alone.

In some of the embodiments described above, for example the embodiments of FIGS. 3 and 5, the reference clock is used directly to clock elements like counter 31 or digital loop filter 32 in FIG. 3 or counter 51 and digital loop filter 52 in FIG. 5. In other words, the clock inputs of these elements are coupled directly with a reference clock input.

In other embodiments, the reference clock input may be coupled indirectly, i.e. with intervening elements, with clock inputs of at least some of the elements of a circuit. The intervening elements may "retime" the clock to a signal output by the respective multiphase DCO or, in other words, "transfer" the reference clock to the clock domain of the multiphase DCO. An example for such an embodiment will be discussed with reference to FIG. 7.

Figure 7:
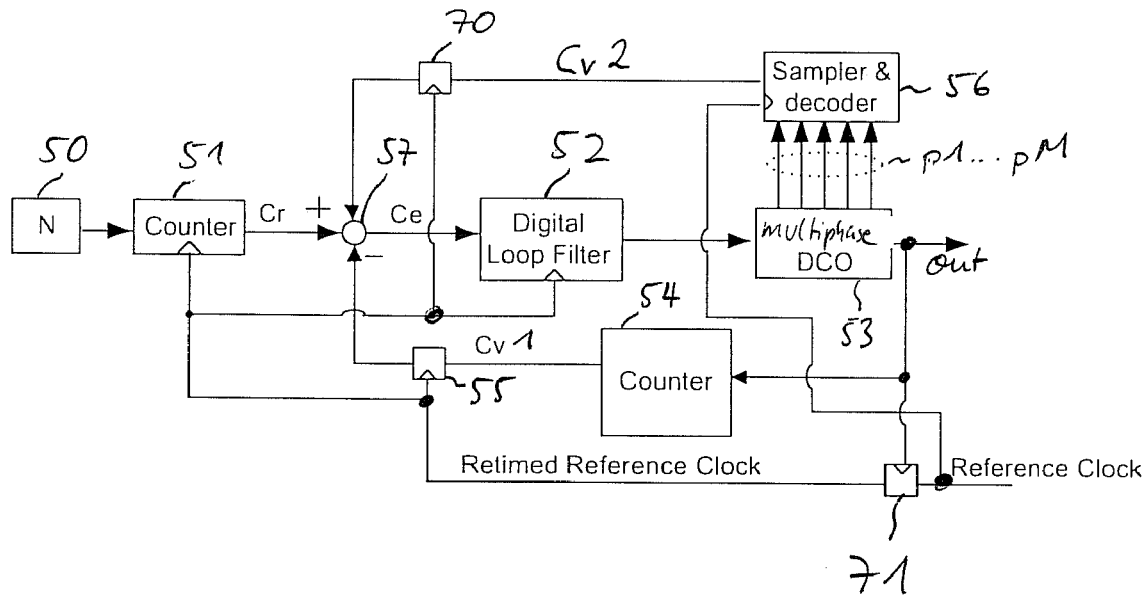
FIG. 7 shows a block diagram of a phase-locked loop according to a further embodiment of the present invention.

The embodiment of FIG. 7 is a modification of the embodiment of FIG. 5, and like elements bear the same reference numeral and will not be described again in detail, but only the differences with respect to the embodiment of FIG. 5 will be described.

In the embodiment of FIG. 5, counter 51, sampling unit 55, digital loop filter 52 and sampler and decoder circuit 56 are clocked with the reference clock directly. In the embodiment of FIG. 7, of the elements shown only sampler and decoder circuit 56 is clocked with the reference clock directly. In a sampling unit 71 which may comprise one or more flip-flops, the reference clock is sampled based on the output signal out of multiphase DCO 53 to generate a "retimed" reference clock, i.e. a reference clock transferred to the clock domain of multiphase DCO 53. In the embodiment of FIG. 7, counter 54, sampling unit 55 and digital loop filter 52 are clocked with this retimed reference clock.

Additionally, a sampling unit 70 is provided between sampler and decoder circuit 56 and subtractor 57 to sample the second feedback value Cv2 based on the retimed reference clock such that the subtractor 57 is fed with the second reference value Cv2 timed according to the retimed reference clock.

Otherwise, the operation of the embodiment of FIG. 7 corresponds to the operation of the embodiment of FIG. 5. It should be noted that a similar modification may be made as regards the embodiment of FIG. 3. For example, in the embodiment of FIG. 3 counter 31, digital loop filter 32 and sampling unit 35 may also be clocked with a retimed reference clock generated as explained with reference to FIG. 7.

It should be noted that in the above embodiments no frequency dividers are used to divide frequencies of signals output by the respective multiphase DCO, e.g. signals P1 to PM. In other embodiments, frequency dividers may be provided.

While in the above embodiments a digitally controlled oscillator has been described within a purely digital phase-locked loop, in other embodiments some elements of the phase-locked loop like the oscillator may comprise analog circuitry.

As explained above, various modifications are possible in the above-described embodiments, and the scope is not intended to be limited by the embodiments, but is intended to be limited only by the appended claims and equivalents thereof.

What is claimed is:

1. A circuit, comprising:
   a multiphase oscillator configured to generate a plurality of output signals, said output signals having the same frequency and different phase offsets,
   a feedback value generator coupled to said oscillator configured to generate a feedback value depending on at least two of said plurality of output signals, the feedback value being based in part on a number of rising edges or falling edges from each output signal detected at the feedback value generator per a given time interval,
   a reference value generator configured to generate a reference value depending on a reference clock and a predetermined value,
   a combiner configured to combine said reference value and said feedback value and to output a combined value, and
   a loop filter configured to generate a control signal to control said multiphase oscillator depending on said combined signal.

2. The circuit of claim 1, wherein said oscillator is a digitally controlled oscillator.

3. The circuit of claim 1, wherein said predetermined value determines a relationship between a frequency of said reference clock and said frequency of said plurality of output signals.

4. The circuit of claim 1, comprising a sampling unit configured to sample said feedback value depending on said reference clock.

5. The circuit of claim 1, further comprising a sampling unit configured to sample said reference clock depending on at least one of said plurality of output signals to generate a retimed reference clock,
   wherein at least one element chosen from the group comprising said reference value generator and said loop filter is clocked depending on said retimed reference clock.

6. The circuit of claim 1, wherein said feedback value generator comprises a counter configured to count edges selected from the group comprising rising edges, falling edges and both rising and falling edges of said at least two of said plurality of output signals.

7. The circuit of claim 1, wherein said feedback value comprises a first feedback value and a second feedback value, and wherein said feedback value generator is configured to generate said first feedback value depending on one of the output signals of said oscillator and to generate said second feedback value depending on said at least two of said plurality of output signals.

8. The circuit of claim 1, further comprising a phase interpolator coupled between said oscillator and said feedback value generator.

9. A circuit, comprising:
   a multiphase digitally controlled oscillator comprising a control input and a plurality of outputs,
   a first counter comprising at least two inputs and an output, each of said at least two inputs being coupled with one of said plurality of outputs of said multiphase digitally controlled oscillator,
   a reference clock input,
   a second counter comprising an input, a clock input and an output, wherein the input of said second counter is coupled with a storage and said clock input of said second counter is coupled with said reference clock input,
   a subtractor, said subtractor comprising a positive input, a negative input and an output, wherein said positive input of said subtractor is coupled with one of said output of said first counter and said output of said second counter and wherein said negative input of said subtractor is coupled with the other one of said output of said first counter and said output of said second counter,
   a digital loop filter comprising an input and an output, wherein said input of said digital loop filter is coupled with said output of said subtractor and wherein said output of said digital loop filter is coupled with said control input of said oscillator; and
   a sampling unit, said sampling unit comprising an output, an input and a clock input, wherein said input of said sampling unit is coupled with said output of said first counter, wherein said input of said sampling unit is coupled with said output of said first counter, wherein said output of said sampling unit is coupled with one of said negative input and said positive input of said subtractor.

10. The circuit of claim 9, wherein said clock input of said sampling unit is coupled with said reference clock input.

11. The circuit of claim 9, wherein said storage stores a predetermined value, said predetermined value being the number of said at least two inputs of said first counter multiplied with an intended ratio between a frequency of output signals of said multiphase digitally controlled oscillator and a frequency of a reference clock signal applied to said reference clock input.

12. A circuit, comprising:
- a multiphase oscillator comprising a plurality of outputs and a control input,
- a first counter comprising an input and an output, wherein the input of said first counter is coupled with one of said outputs of said multiphase oscillator,
- a sampler and decoder circuit, said sampler and decoder circuit comprising at least two inputs and an output, wherein each of said at least two inputs of said sampler and decoder circuit is coupled with one of said outputs of said multiphase oscillator,
- a reference clock input,
- a second counter comprising an input, an output and a clock input, said input of said second counter being coupled with a storage, said clock input of said second counter being coupled with said reference clock input,
- a combiner, wherein a first input of said combiner is coupled with said output of said first counter, wherein a second input of said combiner is coupled with said output of said second counter and wherein a third input of said combiner is coupled with said output of said sampler and decoder circuit, and
- a digital loop filter comprising an input and an output, wherein said input of said digital loop filter is coupled with an output of said combiner and said output of said digital loop filter is coupled with said control input of said multiphase oscillator.

13. The circuit of claim 12, further comprising a sampling unit, said sampling unit having an output, an input and a clock input, wherein said input of said sampling unit is coupled with said first counter, wherein said output of said sampling unit is coupled with said first input of said combiner and wherein said clock input of said sampling unit is coupled with said reference clock input.

14. The circuit of claim 12, wherein said digital loop filter comprises a clock input, wherein said clock input is coupled with said reference clock input.

15. The circuit of claim 12, further comprising a phase interpolator circuit coupled between said multiphase oscillator and said sampler and decoder circuit.

16. The circuit of claim 12, wherein said sampler and decoder circuit comprises a clock input coupled with said reference clock input.

17. The circuit of claim 12, wherein said combiner is selected from the group comprising an adder and a subtractor.

18. A circuit, comprising:
- a multiphase oscillator configured to generate a plurality of output signals, said output signals having the same frequency and different phase offsets,
- a sampler and decoder circuit coupled to said oscillator configured to generate a feedback value, wherein generating said feedback value comprises sampling at least two of said plurality of output signals depending on a reference clock,
- a reference value generator configured to generate a reference value depending on said reference clock and a predetermined value,
- a combiner configured to combine said reference value and said feedback value and to output a combined value, and
- a loop filter configured to generate a control signal to control said multiphase oscillator depending on said combined signal; and
- a further feedback value generator coupled to said oscillator configured to generate a further feedback value depending on at least one of said plurality of output signals.

19. The circuit of claim 18, further comprising wherein said combiner is configured to combine said reference value, said feedback value and said further feedback value to output said combined value.

20. A method, comprising:
- generating a plurality of output signals, said output signals having the same frequency and different phases,
- generating a feedback value depending on at least two of said output signals, the feedback value being based in part on a number of rising edges or falling edges from each output signal detected at a feedback value generator per a given time interval,
- generating a reference value depending on a reference clock and a predetermined value, and
- controlling said generation of said plurality of output signals depending on said reference value and said feedback value.

21. The method of claim 20, further comprising setting said predetermined value to determine a relationship between said frequency of said plurality of output signals and a frequency of said reference clock.

22. The method of claim 20, wherein said controlling step further comprises combining said feedback value and said reference value to form a combined value,
filtering said combined value to generate a control value, and controlling said generation of said plurality of output signals depending on said control value.

23. The method of claim 20, wherein said generating said feedback value comprises counting events chosen from the group consisting of only rising edges of said at least two of said output signals, only falling edges of said at least two of said output signals and both rising and falling edges of said at least two output signals.

24. The method of claim 20, wherein said generating said feedback value comprises generating a first feedback value depending on one of said output signals and generating a second feedback value depending on at least two of said output signals.

25. The method of claim 20, wherein said generating said feedback value comprises sampling said at least two output signals depending on said reference clock signal.

* * * * *